(12) United States Patent
Shen

(10) Patent No.: US 12,199,025 B2
(45) Date of Patent: Jan. 14, 2025

(54) INTERPOSER STRUCTURE CONTAINING EMBEDDED SILICON-LESS LINK CHIPLET

(71) Applicant: DIDREW TECHNOLOGY (BVI) LIMITED, Tortola (BV)

(72) Inventor: Minghao Shen, Tortola (VG)

(73) Assignee: Chengdu ECHINT Technology Co., Ltd., West Chengdu (CN)

( * ) Notice: Subject to any disclaimer, the term of this patent is extended or adjusted under 35 U.S.C. 154(b) by 0 days.

(21) Appl. No.: 17/207,914

(22) Filed: Mar. 22, 2021

(65) Prior Publication Data
US 2022/0302010 A1    Sep. 22, 2022

(51) Int. Cl.
| | |
|---|---|
| *H01L 23/538* | (2006.01) |
| *H01L 21/48* | (2006.01) |
| *H01L 21/56* | (2006.01) |
| *H01L 21/683* | (2006.01) |
| *H01L 21/78* | (2006.01) |
| *H01L 23/31* | (2006.01) |
| *H01L 23/367* | (2006.01) |
| *H01L 23/498* | (2006.01) |
| *H01L 25/00* | (2006.01) |
| *H01L 25/065* | (2023.01) |

(52) U.S. Cl.
CPC .... *H01L 23/49838* (2013.01); *H01L 21/4853* (2013.01); *H01L 21/4857* (2013.01); *H01L 21/565* (2013.01); *H01L 21/6836* (2013.01); *H01L 21/78* (2013.01); *H01L 23/3128* (2013.01); *H01L 23/3675* (2013.01); *H01L 23/49822* (2013.01); *H01L 23/5381* (2013.01); *H01L 23/5383* (2013.01); *H01L 23/5386* (2013.01); *H01L 25/0655* (2013.01); *H01L 25/50* (2013.01); *H01L 2221/68331* (2013.01)

(58) Field of Classification Search
CPC .......................................... H01L 23/538–5389
See application file for complete search history.

(56) References Cited

U.S. PATENT DOCUMENTS

| | | | | |
|---|---|---|---|---|
| 8,288,208 B1* | 10/2012 | Liu | ......... | H01L 21/50 438/118 |
| 9,245,865 B1* | 1/2016 | Kwon | ...... | H01L 24/32 |
| 2015/0371932 A1* | 12/2015 | Hu | ....... | H01L 21/4825 438/123 |
| 2017/0263518 A1* | 9/2017 | Yu | ........ | H01L 23/3128 |
| 2017/0358527 A1* | 12/2017 | Lu | ......... | H01L 21/486 |
| 2020/0035603 A1* | 1/2020 | Rubin | ........ | H01L 23/5381 |
| 2021/0134728 A1* | 5/2021 | Rubin | ...... | H01L 25/50 |
| 2022/0045008 A1* | 2/2022 | Kang | ...... | H01L 23/49838 |

\* cited by examiner

*Primary Examiner* — Evan G Clinton
(74) *Attorney, Agent, or Firm* — Scully, Scott, Murphy & Presser, P.C.

(57) ABSTRACT

An interposer structure is provided that can be used in semiconductor packaging to electrically connect a printed circuit board to a plurality of die. The interposer structure contains a high-density silicon-less link chiplet that is laterally surrounded by, and embedded in, a lower-density redistribution layer interposer.

15 Claims, 11 Drawing Sheets

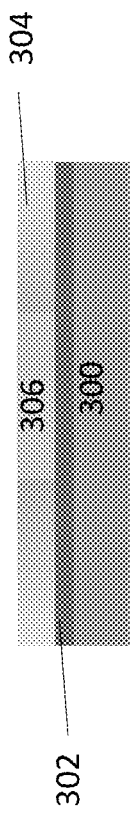
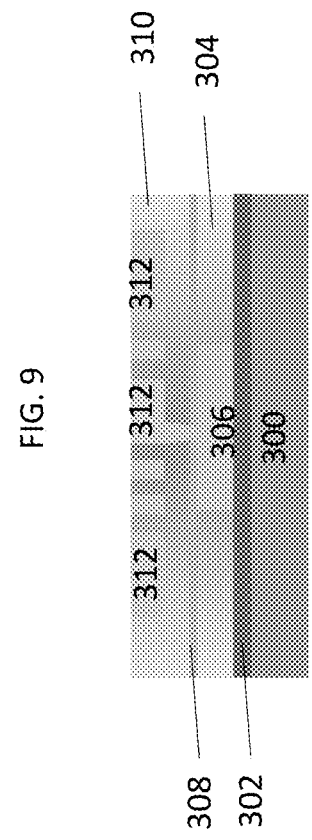
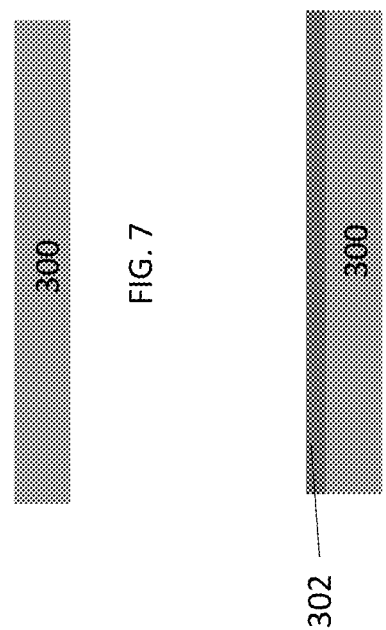
FIG. 7
FIG. 8
FIG. 9
FIG. 10

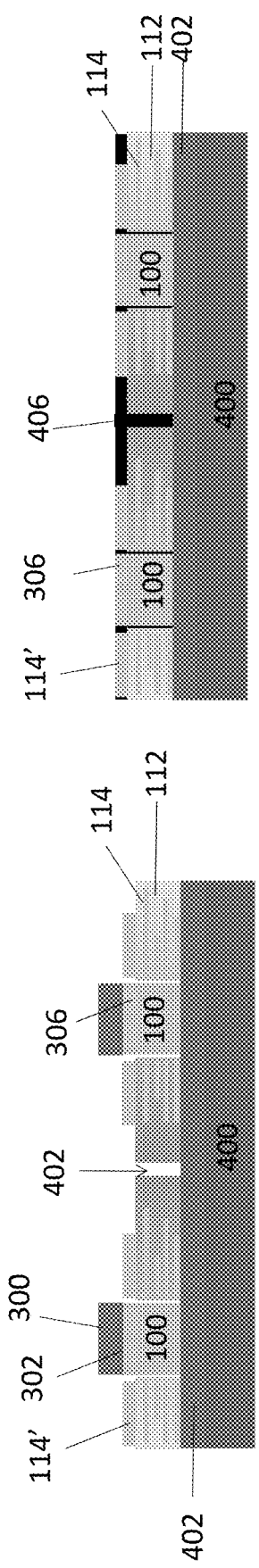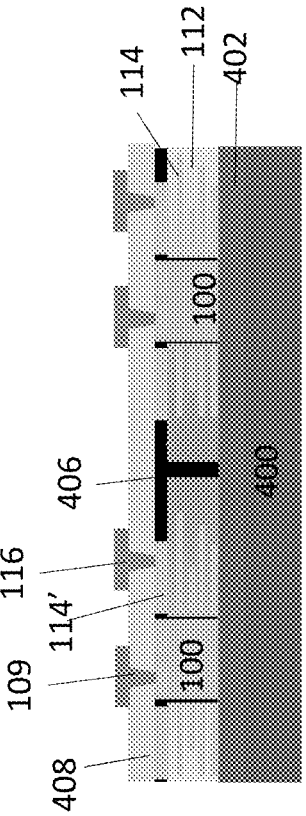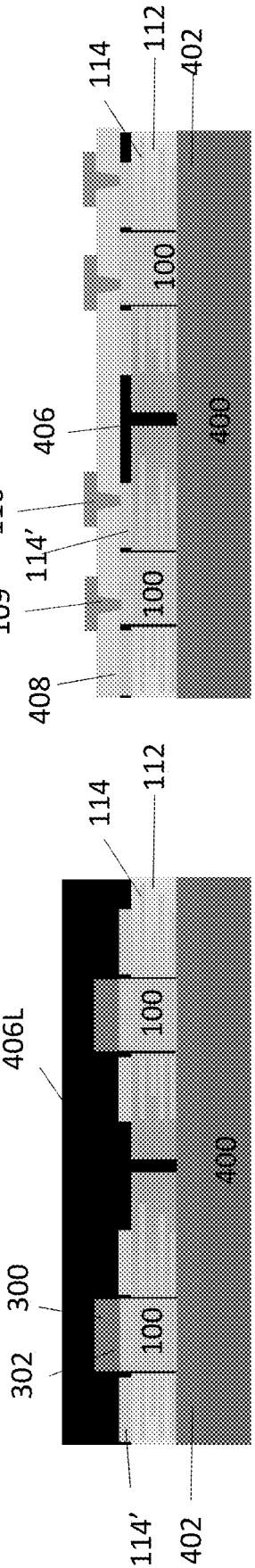

INTERPOSER STRUCTURE CONTAINING EMBEDDED SILICON-LESS LINK CHIPLET

FIELD OF THE INVENTION

The present invention relates to semiconductor packaging technology, and more particularly to a semiconductor packaging device that includes an interposer structure that contains a high-density silicon-less chiplet embedded in a lower-density redistribution layer interposer.

BACKGROUND

An interposer can be defined as a structure that can be used as a bridge, or a conduit, that allows electrical signals to pass through it and onto another element. Interposers are frequently used in multi die chips or boards. The function of an interposer is to either spread the signal to a wider pitch, or take the connection to a different socket on the board.

Various types of interposers for use in semiconductor packaging technology are known including, for example, silicon interposers, glass interposers and organic interposers. Each type of interposer has unique advantages and limitations.

Silicon interposers are essentially links that are attached to the substrate by Through Silicon Vias or TSVs. The silicon interposer can then be metallized from the top, bottom, and side to connect the silicon interposer to the surrounding components of the system. This makes silicon interposers a versatile and adaptable packaging system. However, silicon interposers face performance limitations and are of high cost.

Glass interposers provide high interconnect density and are a low cost alternative to silicon interposers. However, glass interposers face challenges during manufacturing, such as, for example, surface defects that can lead to cracking. Glass interposers also have relatively lower thermal conductivity as compared to silicon interposers, and they have limited effective diameter.

Organic interposers are also a low cost alternative to silicon interposers and such interposers can be formed utilizing traditional processing. One challenge with organic interposers is in their mechanical properties due to their flexibility. Also, organic interposers have a lower fine pitch I/O density than silicon interposers and glass interposers.

SUMMARY

An interposer structure is provided that can be used in semiconductor packaging to electrically connect a printed circuit board to a plurality of die. The interposer structure contains a high-density silicon-less link chiplet that is laterally surrounded by, and embedded in, a lower-density redistribution layer interposer. The term "silicon-less link chiplet" denotes a multilevel structure that contains a plurality of interconnect dielectric material layers that are not solely composed of elemental silicon; the silicon-less chiplet can include silicon-containing compounds such as, for example, a silioxane or a silsesquioxane. The high-density silicon-less link chiplet of the inventive interposer structure provides high-density inter-die connection that is beyond high-band width memory needs. The redistribution layer interposer of the interposer structure provides higher routing density than advanced organic interposers.

In one aspect of the present invention, a semiconductor packaging device is provided. In one embodiment, the semiconductor packaging device of the present invention includes an interposer structure electrically connecting a printed circuit board to a plurality of die. The interposer structure includes a silicon-less link chiplet having a first interconnect density laterally surrounded by, and embedded in, a redistribution layer interposer having a second interconnect density that is less than the first interconnect density.

In another aspect of the present application, a method of fabricating a device is provided. In one embodiment of the present invention, the method includes forming a plurality of diced silicon-less link chiplets having a first interconnect density, wherein each of the diced silicon-less link chiplets is located on a buffer layer that is disposed on a supporting wafer and comprises a first multilevel structure comprising a plurality electrically conductive structures and a plurality of interconnect dielectric material layers; forming a second multilevel structure having a second interconnect density that is less than the first interconnect density, wherein the second multilevel structure is located on a temporary bonding layer that is disposed on a handle substrate and comprises a plurality of second electrically conductive structures and a plurality of redistribution dielectric material layers; forming cavities in the plurality of redistribution dielectric material layers that physically expose a surface of the temporary bonding layer; inserting one of the diced silicon-less link chiplets of the plurality of diced silicon-less link chiplets into each of the cavities; removing the supporting wafer and buffer layer to physically expose one of the first electrically conductive structures present in each of the diced silicon-less link chiplets; and forming a topmost redistribution dielectric material layer embedding each of the diced silicon-less link chiplets, wherein the topmost redistribution dielectric material layer contains micro metallic pads contacting one of the first electrically conductive structures present in the diced silicon-less link chiplets and metallic pads contacting one of the second electrically conductive structures on the second multilevel structure.

BRIEF DESCRIPTION OF THE DRAWINGS

FIGS. 7-12 illustrate the various processing steps used in fabricating a silicon-less link chiplet of the interposer structure of the present invention.

FIGS. 13-19 illustrate the various processing steps used in fabricating the interposer structure of the present invention.

DETAILED DESCRIPTION

Figure 1:
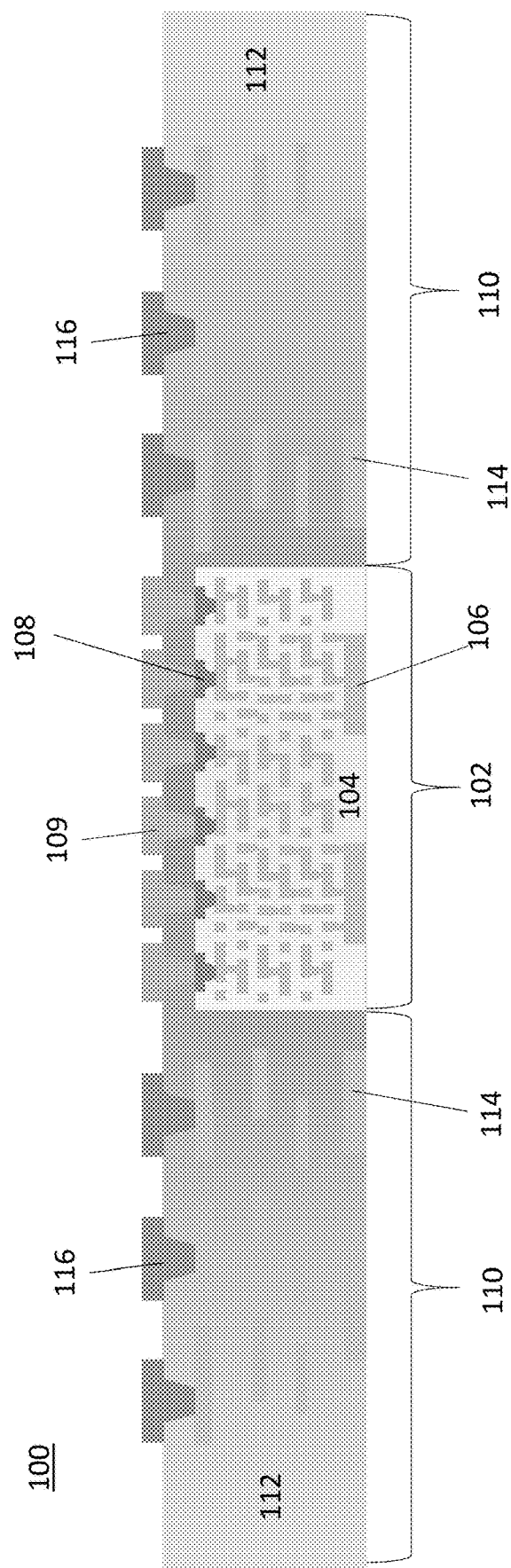
FIG. 1 is a cross sectional view of an interposer structure in accordance with an embodiment of the present invention.

The present invention will now be described in greater detail by referring to the following discussion and drawings that accompany the present invention. It is noted that the drawings of the present invention are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present invention. However, it will be appreciated by one of ordinary skill in the art that the various embodiments of the present invention may be practiced without these specific details. In other instances, well-known structures or processing steps have not been described in detail in order to avoid obscuring the present invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides an interposer structure 100 such as is shown in FIG. 1, which can be used in semiconductor packaging to electrically connect a printed circuit board to a plurality of die. The inventive interposer structure 100 shown in FIG. 1 includes a silicon-less link chiplet 102 having a first interconnect density laterally surrounded by, and embedded in, a redistribution layer (RDL) interposer 110 having a second interconnect density that is less than the first interconnect density. That is, and in the present invention, the amount of first interconnect structures (per unit volume) present in the silicon-less link chiplet 102 is greater than the amount of interconnect structures (per unit volume) present in the redistribution layer interposer 110. In one embodiment of the present invention, the first interconnect density is 10× greater than the second interconnect density. In yet another embodiment of the present invention, the first interconnect density is 100× greater than the second interconnect density. Although the present invention describes and illustrates a single silicon-less link chiplet 102 within the interposer structure 100, the present invention contemplates embodiments in which a plurality of silicon-less link chiplets 102 are present in the interposer structure 100; in such embodiments each silicon-less link chiplet 102 is laterally surrounded, and embedded within, the redistribution layer interposer 110.

In the present invention and within a semiconductor package device containing a plurality of die, the silicon-less link chiplet 102 provides high inter-die connection between two adjacent die of the plurality of die. Also, and within the same semiconductor package device, the redistribution layer interposer 110 that laterally surrounds the silicon-less link chiplet 102 provides connection to one of the die of the plurality of die. These aspects of the present invention will become more apparent when viewing the semiconductor packaging device shown in FIGS. 2-6 of the present invention.

The silicon-less link chiplet 102 comprises a first multi-level structure (104/106) including a plurality of first electrically conductive structures 106 (i.e., first interconnect structure) and a plurality of interconnect dielectric material layers 104. In accordance with the present invention, the first electrically conductive structures 106 are embedded in the plurality of interconnect dielectric material layers 104. The first electrically conductive structures 106 can include any combination of via structures and/or line (trench) structures. The first electrically conductive structures 106 can be composed of an electrically conductive metal or an electrically conductive metal alloy. Examples of electrically conductive metals that can provide the first electrically conductive structures 106 include, but are not limited to, copper (Cu), aluminum (Al), tungsten (W) or cobalt (Co). An example of an electrically conductive metal alloy that can provide the first electrically conductive structures 106 is a Cu—Al alloy. In one embodiment, each first electrically conductive structure 106 can be composed of a compositionally same electrically conductive material (i.e., electrically conductive metal or electrically conductive metal alloy). In another embodiment, each first electrically conductive structure 106 can be composed of a compositionally different electrically conductive material. In yet a further embodiment, a first set of first electrically conductive structures 106 can be composed of a first electrically conductive material, while a second set of first electrically conductive structures 106 can be composed of a second electrically conductive material that is compositionally different from the first electrically conductive material. Other variations for the compositionally make-up of the first electrically conductive structures 106 are possible in the present invention.

Although not shown, a diffusion barrier liner can be located on at least the sidewalls of the first electrically conductive structures 106. The diffusion barrier liner can be composed of a diffusion material such as, for example, titanium (Ti), tantalum (Ta), titanium nitride (TiN) or tantalum nitride (TaN).

Each interconnect dielectric material layer of the plurality of interconnect dielectric material layers 104 that provides the silicon-less link chiplet 102 includes any interlevel dielectric material (inorganic or organic) that does not solely contain elemental silicon. Examples of interlevel dielectric materials that can be used as the interconnect dielectric material layer of the plurality of interconnect dielectric material layers 104 include, but are not limited to, undoped or doped silicate glass, silsesquioxanes, C doped oxides (i.e., organosilicates) that include atoms of Si, C, O and H, theremosetting polyarylene ethers or any multilayered combination thereof. In one embodiment, each of the interconnect dielectric material layers of the plurality of interconnect dielectric material layers 104 can be composed of a compositionally same interlevel dielectric material. In another embodiment, each of the interconnect dielectric material layers of the plurality of interconnect dielectric material layers 104 can be composed of a compositionally different interlevel dielectric material. In yet a further embodiment, a first set of interconnect dielectric material layers of the plurality of interconnect dielectric material layers 104 can be composed of first interlevel dielectric material, while a second set of interconnect dielectric material layers of the plurality of interconnect dielectric material layers 104 can be composed of second interlevel dielectric material that is compositionally different from the first interconnect dielectric material. Other variations for the compositionally make-up of the interconnect dielectric material layers of the plurality of interconnect dielectric material layers 104 are possible in the present invention.

In some embodiments (not shown in FIG. 1), a dielectric capping layer can be present between the interconnect dielectric material layers of the plurality of interconnect dielectric material layers 104 When present, the dielectric capping layer may include any dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials.

The redistribution layer interposer 110 comprises a second multilevel structure that includes a plurality of second electrically conductive structures 114 (i.e., second interconnect structures) and a plurality of redistribution dielectric material layers 112. In accordance with the present invention, the second electrically conductive structures 114 are embedded in the plurality of redistribution dielectric material layers 112. The second electrically conductive structures 114 are typically metal lines. The second electrically conductive structures 114 can be composed of one of the electrically conductive metals or metal alloys that provide the first electrically conductive structure 106; the electrically conductive material that provides the second electrically conductive structures can be compositionally the same as, or compositionally different from, the electrically conductive material that provides the first electrically conductive structures 106 In some embodiments, each second electrically conductive structures 114 can be composed of a compositionally same, or compositionally different electrical conductive material. In yet a further embodiment, a first set of second electrically conductive structures 114 can be composed of a first electrically conductive material, while a second set of second electrically conductive structures 114 can be composed of a second electrically conductive material that is compositionally different from the first electrically conductive material. Other variations for the compositionally make-up of the second electrically conductive structures are possible in the present invention.

Although not shown, a diffusion barrier liner can be located on at least the sidewalls of the second electrically conductive structures 114. The diffusion barrier liner can be composed of a diffusion material such as, for example, titanium (Ti), tantalum (Ta), titanium nitride (TiN) or tantalum nitride (TaN).

Each redistribution dielectric material layer of the plurality of redistribution dielectric material layers 112 that provides redistribution layer interposer 110 is composed of an organic dielectric material. In one example, each redistribution dielectric material layer 112 is composed of a polyimide. The organic dielectric material that provides the redistribution dielectric material layer of the plurality of redistribution dielectric material layers 112 can be compositionally the same as, or compositionally different from, the dielectric material that provides the interconnect dielectric material layers 104. Each redistribution dielectric material layer of the plurality of redistribution dielectric material layers 112 can be composed of a compositionally same, or compositionally different, organic dielectric material. In some instances, a first set of redistribution dielectric material layers of the plurality of redistribution dielectric material layers 112 can be composed of first organic dielectric material, while a second set of redistribution dielectric material layers of the plurality of redistribution dielectric material layers 112 can be composed of second organic dielectric material that is compositionally different from the first dielectric material. Other variations for the compositionally make-up of the redistribution dielectric material layers of the plurality of redistribution dielectric material layers 112 are possible in the present invention.

As is shown in FIG. 1, a first portion of the redistribution layer interposer 110 is laterally adjacent to a first sidewall of the silicon-less link chiplet 102 and a second portion of the redistribution layer interposer 110 is laterally adjacent to a second sidewall of the silicon-less link chiplet 102. The first and second portions of the redistribution layer interposer 110 are connected by a bridging portion that lies on (and thus embeds) the silicon-less link chiplet 102. The first and second portions of the redistribution layer interposer 110 contain second electrically conductive structures 114, while the bridging portion does not contain any second electrically conductive structure 114.

FIG. 1 also shows interposer metallic pads 116 located on the redistribution layer interposer 110 that contains the second electrically conductive structures 114. Each interposer metallic pad 116 is in direct physical contact with one of the second electrically conductive structures 114. The interposer metallic pads 116 can be composed of Cu or any other conductive pad material. The interposer metallic pads 116 can be formed utilizing techniques well known to those skilled in the art.

FIG. 1 further shows micro metallic pads 109 embedded in, and located on, the bridging portion of the redistribution layer interposer 110. Each micro metallic pad 109 contacts a pad structure 108 that is present in the silicon-less link chip. Each micro metallic pad 109 and pad structure 108 can be composed of Cu or any other conductive pad material. The pad structures 108 and micro pads 109 can be formed utilizing techniques well known to those skilled in the art.

Referring now to FIGS. 2-6, there are shown various semiconductor packaging devices in accordance with various embodiments of the present invention and each including the interposer structure 100 of FIG. 1. Notably, each of FIGS. 2-6 illustrates a semiconductor packaging device including an interposer structure 100 in accordance with the present invention electrically connecting a printed circuit board 200 to a plurality of die ($D_1$, $D_n$ wherein n is an integer greater than 1). As mentioned above in regard to FIG. 1, interposer structure 100 includes a silicon-less link chiplet 102 having a first interconnect density laterally surrounded by, and embedded in, a redistribution layer interposer 110 having a second interconnect density that is less than the first interconnect density. Within the various embodiments shown in FIGS. 2-6, the silicon-less link chiplet 102 provides inter-die connection between two adjacent die, e.g., $D_1$, $D_n$, of the plurality of die ($D_1$, $D_n$), while the redistribution layer interposer 110 surrounding the silicon-less link chiplet 102 provides a connection to one of the die (e.g., $D_1$, or $D_n$) of the plurality of die ($D_1$, $D_n$).

Printed circuit board (PCB) 200 includes at least one insulating material such as, for example, fiberglass or a glass-reinforced plastic, with conductive traces (e.g., copper traces) present in the at least one insulating material. PCB 200 may be single-layered or multilayered. PCB 200 can be made utilizing techniques well known to those skilled in the art.

Each die, e.g., $D_1$, $D_n$, of the plurality of die ($D_1$, $D_n$) is a small block of semiconductor material on which a given functional circuit is fabricated. Each die, e.g., $D_1$, $D_n$, of the plurality of die ($D_1$, $D_n$) includes materials well known to those skilled in the art, and the dies can be fabricated utilizing techniques well known to those skilled in the art. For example, integrated circuits are typically formed in large batches on a single semiconductor wafer through well known processes including, for example, photolithography. The wafer is then cut (i.e., diced) into many pieces (i.e., the dies), each containing a copy of the circuit.

Figure 2:
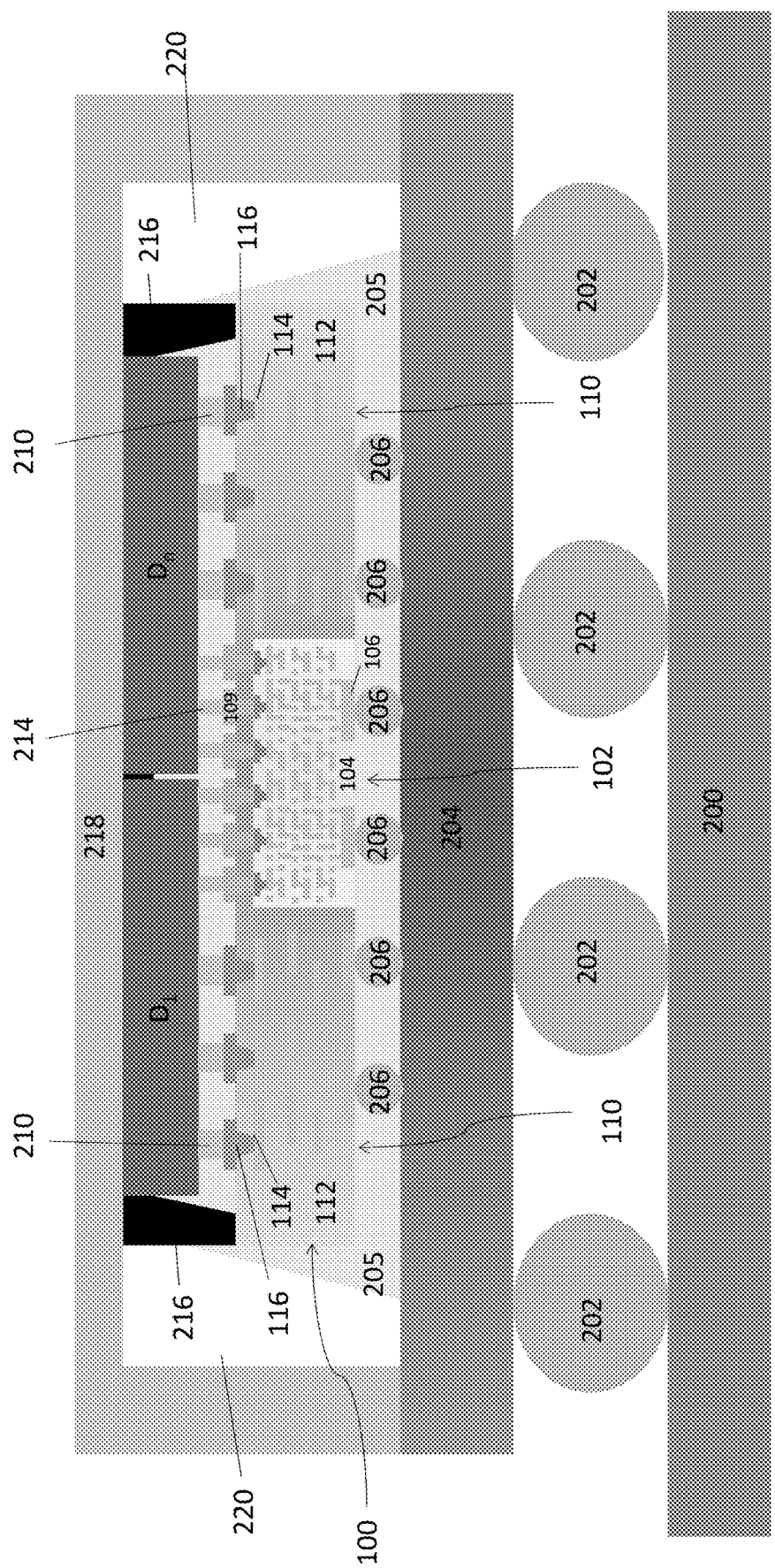
FIG. 2 is a cross sectional view of a semiconductor packaging device including the interposer structure of FIG. 1 and in accordance with a first embodiment of the present invention.

Referring to the specific embodiment depicted in FIG. 2 (which represent a first embodiment of the present invention), the illustrated semiconductor packaging device of FIG. 2 further includes organic substrate 204 positioned between the interposer structure 100 and the PCB 200. The organic substrate 204 is optionally and can be omitted in some embodiments of the present invention. When present, the organic substrate 204 can be composed of a polymeric material such as, for example, a polyimide. The organic substrate 204 can act as an electrically conductive interconnect between the PCB 200 and the die, e.g., $D_1$, $D_n$, of the plurality of die ($D_1$, $D_n$). The organic substrate 204 also provides mechanical and environmental protection to the semiconductor packaging device, and the organic substrate 204 can also facilitate heat distribution, signal distribution and power distribution.

When present, a first surface of the organic substrate 204 is electrically attached to the PCB 200 by an array of solder balls 202 (commonly referred to as a ball grid array or BGA for short). The solder balls 202 are composed of any well known solder material used in semiconductor packaging devices, and solder balls 202 are formed utilizing techniques that are also well known to one skilled in the art. In one example, the solder balls 202 are lead-free solder balls formed utilizing a BGA solder forming process.

The second surface of the organic substrate 204, which is opposite to the first surface of the organic substrate 204, is electrically attached to the interposer structure 100 by another array of solder balls 206. The another array of solder balls 206 can be composed of any well known solder material and can be formed utilizing techniques well known to those skilled art. In one example, the solder balls 206 are composed of a lead-tin alloy or a lead-free alloy and the solder balls 206 are formed utilizing a controlled collapse chip connection (C4) process. As is shown, some of the solder balls 206 are formed on a physically exposed surface of the second electrically conductive structures 114 that are present in the redistribution layer interposer 110, while other solder balls 206 are formed on a physically exposed surface of the first electrically conductive structures 106 that are present in the silicon-less link chiplet 102. Solder balls 206 are typically smaller in diameter than solder balls 202.

The semiconductor packaging device of FIG. 2 also includes an underfill material containing region 205 that laterally surrounds, and can be positioned above and below, the interposer structure 100 of the present invention. As is shown, the underfill material containing region 205 also encases solder balls 206, exposed portions of the interposer metallic pads 116 and micro metallic pads 109, and interposer metallic pillars 210 and micro metallic pillar 214 (pads 116 and pillars 210 electrically connect the redistribution layer interposer 110 to an overlying die of the plurality, while pads 109 and pillars 214 electrically connect the silicon-less link chiplet 102 to a neighboring pair of die of the plurality of die). The interposer metallic pillars 210 and micro metallic pillar 214 are composed of any well known conductive pillar material including, for example, copper. The interposer metallic pillars 210 and micro metallic pillar 214 can be formed utilizing techniques well known in the art.

Underfill material containing region 205 is composed of at least one resin having a coefficient of thermal expansion (CTE) that substantially matches (i.e., within ±10%) the CTE of the solder balls 206. In one example, the resin that provides the underfill material containing region 205 is composed of a composite containing an epoxy polymer and a filler. The underfill material containing region 205 can be formed by depositing the resin and thereafter subjecting the deposited resin to a curing process. The underfill material containing region 205 acts as a cushion between the various components that are present in the underfill material containing region 205, and also protects the solder joints provided by solder balls 206. When the organic substrate 204 is present, the underfill material containing region 205 contacts the second surface of the organic substrate 204. In some embodiments, the underfill material containing region 205 is optional.

The semiconductor packaging device shown in FIG. 2 further includes an epoxy molding compound containing layer 216 that laterally surrounds the plurality of die, and contacts a surface of the redistribution layer interposer 110. The epoxy molding compound containing layer 216 protects the integrated circuits that are present in each die from moisture, heat and shock. The epoxy molding compound containing layer 216 can be composed of any well known material including for example, a composite of an epoxy resin, hardener, silica and additives. The epoxy molding compound containing layer 216 can be formed by deposition and curing.

The semiconductor packaging device shown in FIG. 2 further includes an integrated heat spreader 218 encasing the interposer structure 100 and the plurality of die ($D_1$, $D_n$). In this illustrated embodiment, the integrated heat spreader 218 is located on a topmost surface of the epoxy molding compound containing layer 216 and a topmost surface of each die of the plurality of die ($D_1$, $D_n$). The integrated heat spreader 218 of this embodiment of the present invention has a surface that contacts the second surface of the organic substrate 204. In this embodiment, a void 220 is located between an interior sidewall of the integrated heat spreader 218 and both the epoxy molding compound containing layer 216 and the redistribution layer interposer 110.

The integrated heat spreader 218 facilitates the transfer of heat that is generated by the die during operational use. The integrated heat spreader 218 can be composed of any well known material that is capable of transfer energy as heat from a hotter source to a colder source. Examples of materials that can be employed as the integrated heated spreader 218 include, but are not limited to, heat conductive metals and alloys, such as Cu, or other heat conductive materials, such as carbon nano-tube or grapheme. The integrated heat spreader 218 can be formed utilizing techniques well known to those skilled in the art.

Figure 3:
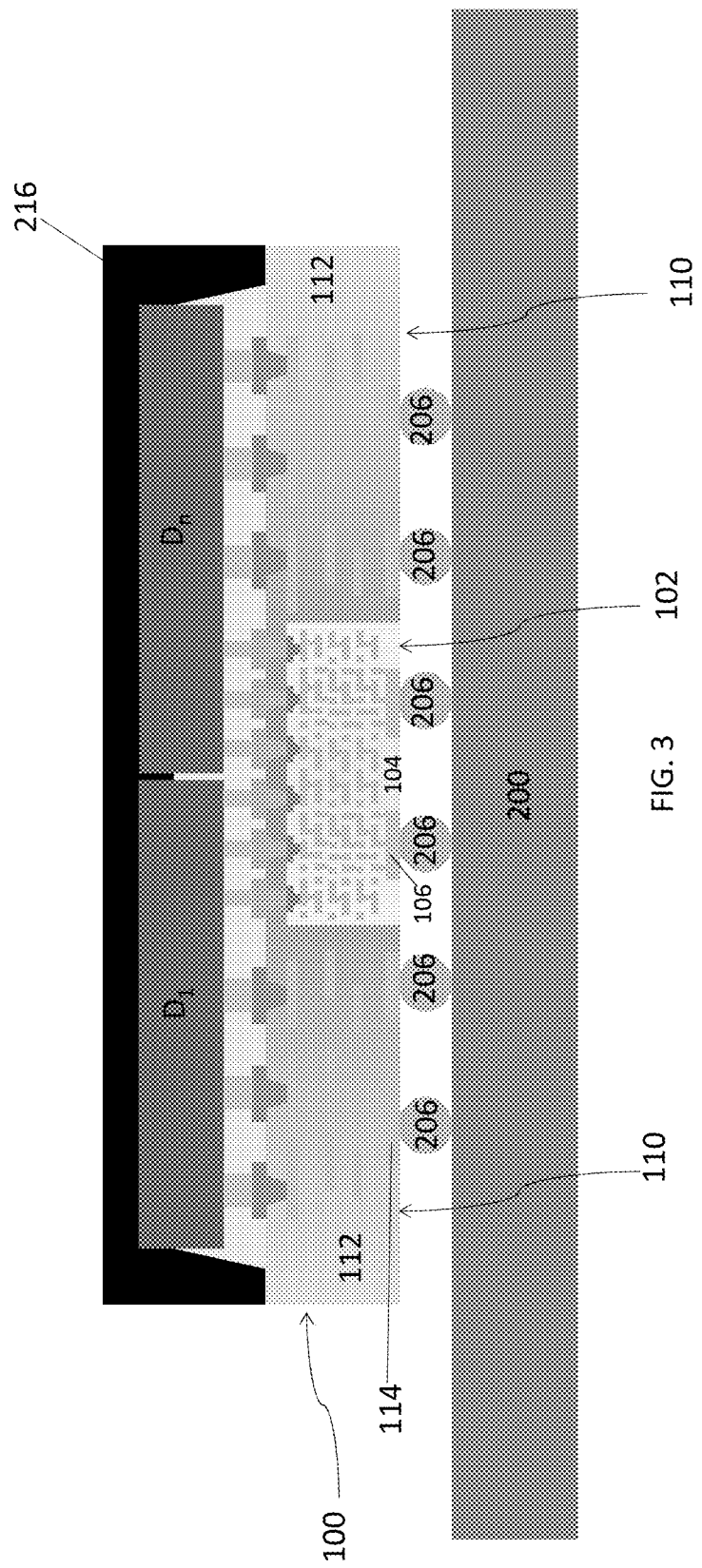
FIG. 3 is a cross sectional view of a semiconductor packaging device including the interposer structure of FIG. 1 and in accordance with a second embodiment of the present invention.

Referring now to FIG. 3, there is illustrated a semiconductor packaging device in accordance with second embodiment of the present invention. The semiconductor packaging device of the second embodiment of the present invention is similar to the semiconductor packaging device of the first embodiment of the present invention except that no organic substrate 204, no array of solder balls 202, and integrated heat spreader 218 are used. In the semiconductor packaging device of the second embodiment of the present invention, the epoxy molding compound containing layer 216 surrounds the plurality of die, and contacts a topmost surface of the redistribution layer interposer 110. Although not shown, an underfill material containing region 205 can be located beneath the interposer structure 100 of FIG. 3 so as to encase solder balls 206.

Figure 4:
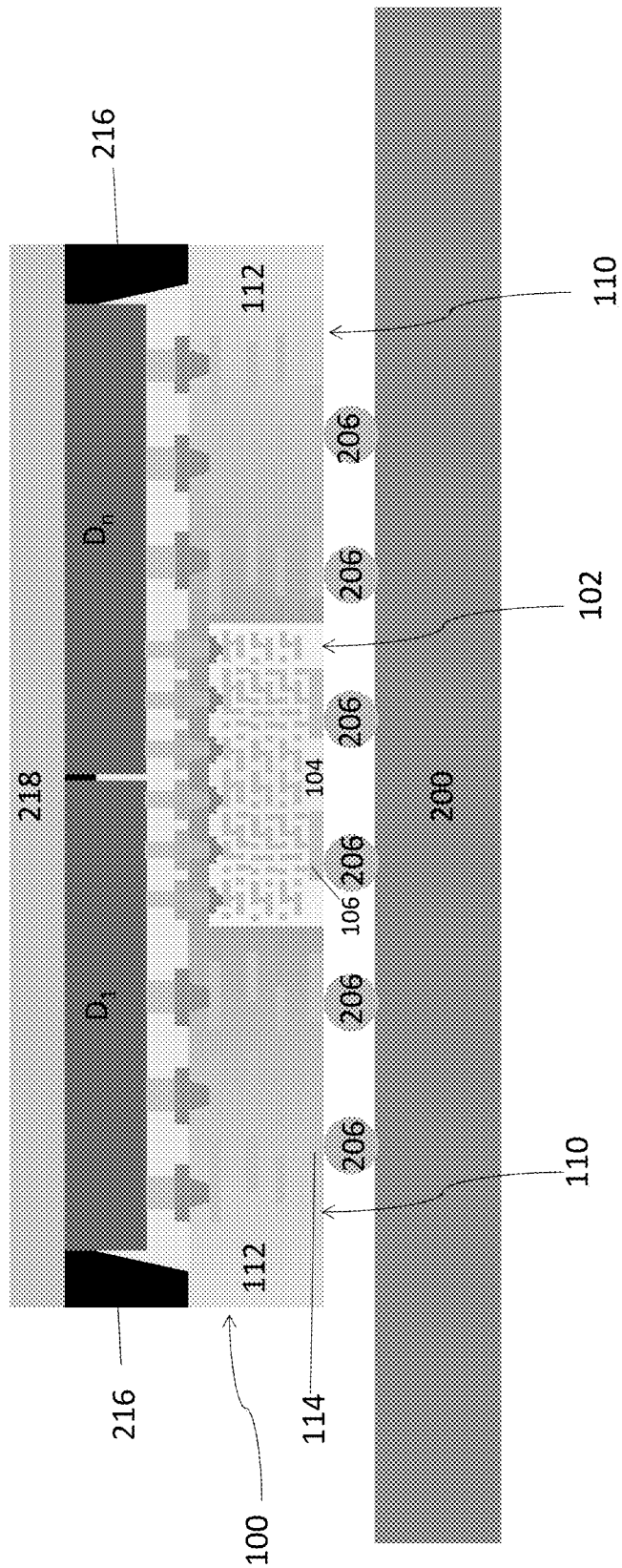
FIG. 4 is a cross sectional view of a semiconductor packaging device including the interposer structure of FIG. 1 and in accordance with a third embodiment of the present invention.

Referring now to FIG. 4, there is illustrated a semiconductor packaging device in accordance with third embodiment of the present invention. The semiconductor packaging device of the third embodiment of the present invention is similar to the semiconductor packaging device of the first embodiment of the present invention except that no organic substrate 204 and no array of solder balls are used. Also, in the third embodiment, integrated heat spreader 218 is confined to a topmost surface of the epoxy molding compound containing layer 216 and each die of the plurality of die ($D_1$, $D_n$). Although not shown, an underfill material containing region 205 can be located beneath the interposer structure 100 of FIG. 4 so as to encase solder balls 206.

Figure 5:
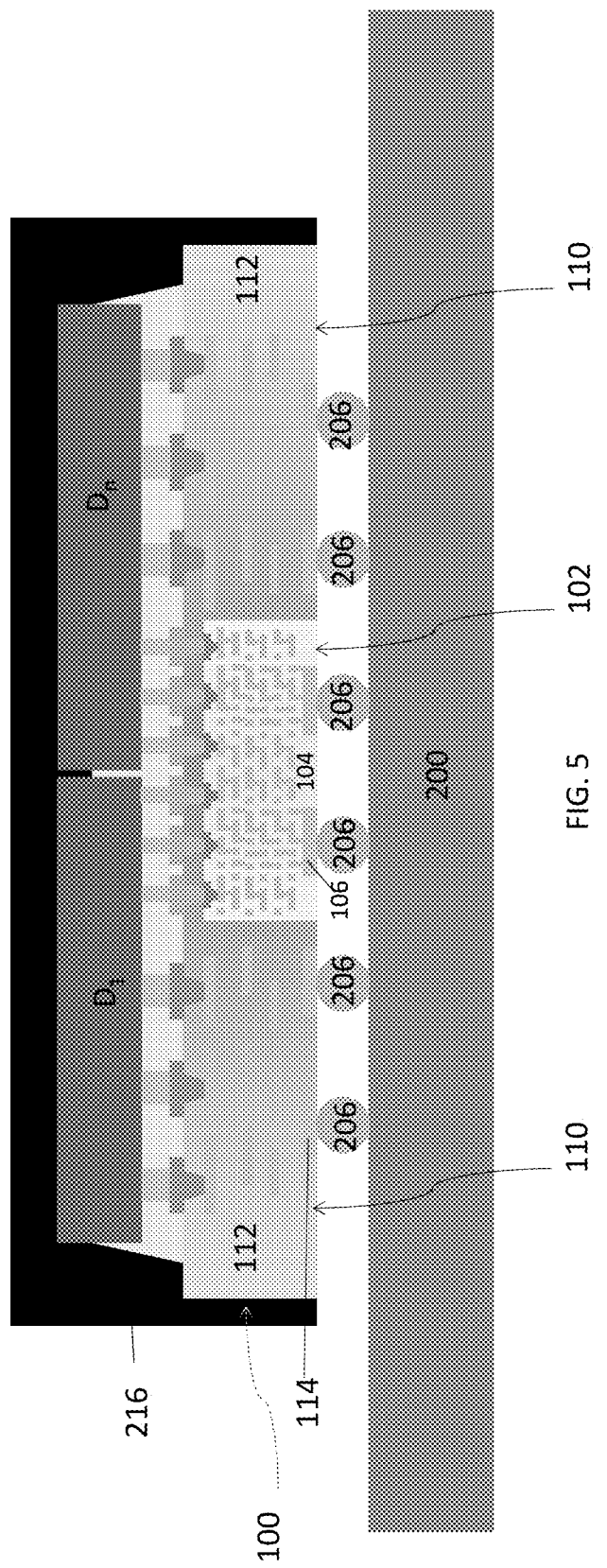
FIG. 5 is a cross sectional view of a semiconductor packaging device including the interposer structure of FIG. 1 and in accordance with a fourth embodiment of the present invention.

Referring now to FIG. 5, there is illustrated a semiconductor packaging device in accordance with fourth embodiment of the present invention. The semiconductor packaging device of the fourth embodiment of the present invention is similar to the semiconductor packaging device of the first embodiment of the present invention except that no organic substrate 204, no array of solder balls 202, and no integrated heat spreader 218 are employed. In the semiconductor packaging device of the fourth embodiment of the present invention, the epoxy molding compound containing layer 216 surrounds the plurality of die and the interposer structure 100, and is present on a topmost surface of each die of the plurality of die. As shown in the fourth embodiment of the present, a portion of the epoxy molding compound containing layer 216 contacts a sidewall of redistribution layer interposer 110 of the interposer structure 100. Although not shown, an underfill material containing region 205 can be located beneath the interposer structure 100 of FIG. 5 so as to encase solder balls 206.

Figure 6:
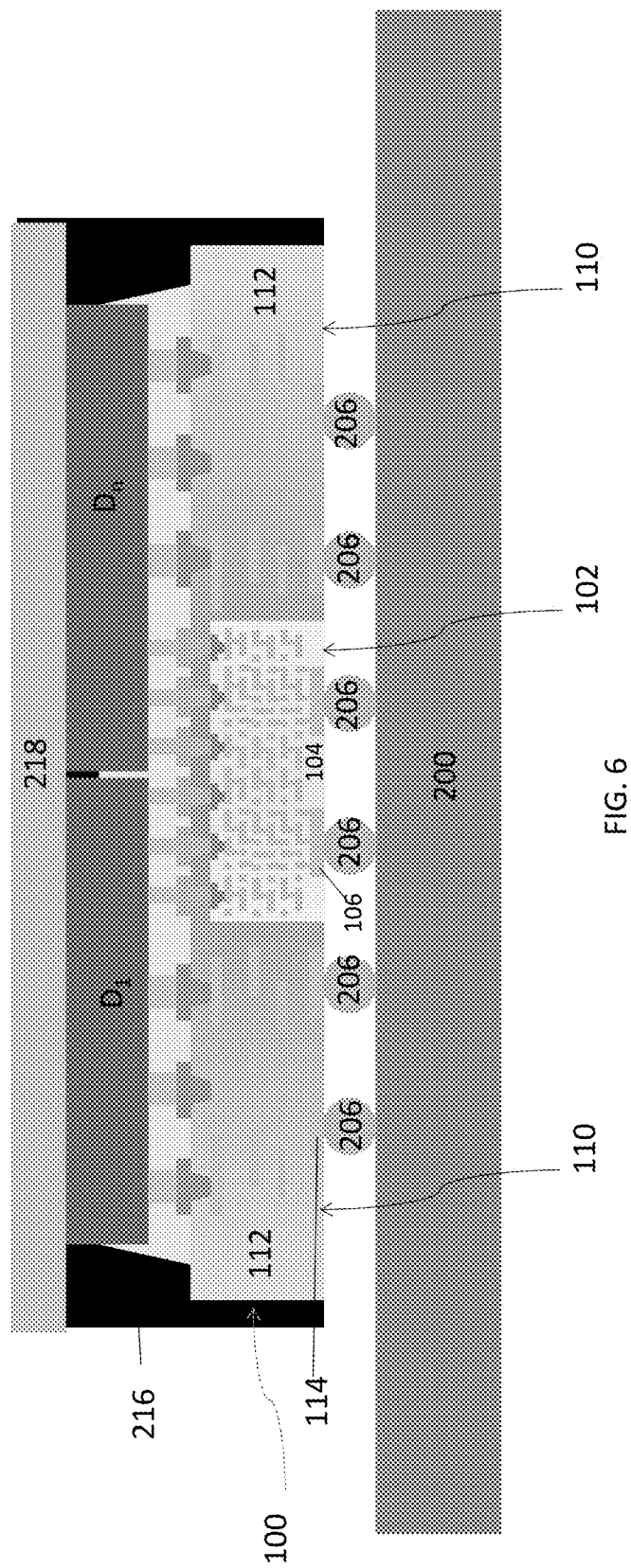
FIG. 6 is a cross sectional view of a semiconductor packaging device including the interposer structure of FIG. 1 and in accordance with a fifth embodiment of the present invention.

Referring now to FIG. 6, there is illustrated a semiconductor packaging device in accordance with fifth embodiment of the present invention. The semiconductor packaging device of the fifth embodiment of the present invention is similar to the semiconductor packaging device of the fourth embodiment of the present invention except that the epoxy molding compound containing layer 216 only surrounds the plurality of die and the interposer structure 100, and an integrated heat spreader 218 is present on a topmost surface of each die and a topmost surface of the epoxy molding compound containing layer 216. Although not shown, an underfill material containing region 205 can be located beneath the interposer structure 100 of FIG. 6 so as to encase solder balls 206.

Referring now to FIGS. 7-12, there are illustrated various processing steps that can be used in fabricating a silicon-less link chiplet 102 of the interposer structure 100 of the present invention. The process of fabricating the silicon-less link chiplet 102 begins by providing a supporting wafer 300 as is shown in FIG. 7. Supporting wafer 300 is composed of any material that is capable of supporting a multilayered interconnect structure. Examples of materials that can be used as the supporting wafer 300 include, but are not limited to, silicon, glass, sapphire or a ceramic. Next, and as is shown in FIG. 8, a buffer layer 302 is formed on the supporting wafer 300. Buffer layer 302 can be composed of a dielectric material such as, for example, silicon dioxide and/or silicon nitride. Buffer layer 302 can be formed utilizing any well known deposition process including, for example, chemical vapor deposition (CVD), plasma enhanced chemical vapor deposition (PECVD), or physical vapor deposition (PVD).

After forming the buffer layer 302 and as is shown in FIG. 9, a lower interconnect level including interconnect dielectric material layer 304 and electrically conductive structure 306 is formed; electrically conductive structure 306 is subsequently used as pad structure in the present invention. This lower interconnect level is formed utilizing a single damascene process in which interconnect dielectric material layer 304 is deposited and patterned to contain at least one opening The depositing of the interconnect dielectric material layer 304 includes, but is not limited to, CVD, PECD, evaporation or spin-on coating. The patterning includes photolithographic patterning. The interconnect dielectric material layer 304 includes any interlevel dielectric material (inorganic or organic) that does not solely contain elemental silicon, as is defined above for the plurality of interconnect dielectric material layers 104. The opening is then filled with one of the electrically conductive metals or metal alloys mentioned above for first electrically conductive structures 106 The filling of the opening with an electrically conductive metal or metal alloy can include any well known deposition process including, for example, CVD, PECD, plating, or sputtering. A planarization process such as, for example, chemical mechanical planarization (CMP), can follow the deposition of the electrically conductive metal or metal alloy. These steps of metal fill and planarization provide electrically conductive structure 306.

Next, and as is shown in FIG. 10, a dielectric capping layer 308 is formed on the structure shown in FIG. 9 (formation of dielectric capping layer 308 is optional), followed by the formation of a next interconnect level which includes electrically conductive structures 312 embedded in interconnect dielectric material layer 310; the dielectric capping layer 308 is patterned such that at least one of the electrically conductive structures 312 is formed in direct physical contact with electrically conductive structure 306. The dielectric capping layer 308 is composed of one of the dielectric capping materials previously mentioned in this disclosure. The dielectric capping layer 308 can be formed utilizing a deposition process such as, for example, CVP, PECVD, PVD, atomic layer deposition (ALD) or spin-on coating. Next, interconnect dielectric material layer 310 is formed on the dielectric capping layer 308. The interconnect dielectric material layer 310 can be formed utilizing one of the deposition processes mentioned above for interconnect dielectric material layer 304. The interconnect dielectric material layer 310 includes any interlevel dielectric material that does not solely contain elemental silicon, as is defined above for the plurality of interconnect dielectric material layers 104. Openings are then formed into interconnect dielectric material layer 310 utilizing at least one iteration of photolithographic patterning; during the forming of the opening into the interconnect dielectric material layer 310, the dielectric capping layer 308 is opened so as to physically expose a surface of electrically conductive structure 306. The openings are then filled with one of the electrically conductive metals or metal alloys mentioned above for first electrically conductive structures 106. The filling of the opening with an electrically conductive metal or metal alloy can include any well known deposition process including, for example, CVD, PECD, plating, or sputtering. A planarization process such as, for example, chemical mechanical planarization (CMP), can follow the deposition of the electrically conductive metal or metal alloy. These steps of metal fill and planarization provide electrically conductive structure 312.

Figure 11:
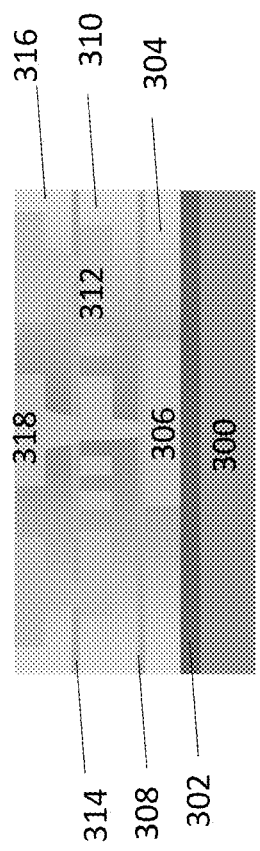

Next, and as is shown in FIG. 11, another dielectric capping layer 314 is formed on the structure shown in FIG. 10 (formation of dielectric capping layer 314 is also optional), followed by the formation of another interconnect level which includes electrically conductive structures 318 embedded in interconnect dielectric material layer 316. The another dielectric capping layer 314 is composed of one of the dielectric capping materials previously mentioned in this disclosure. The another dielectric capping layer 314 can be formed utilizing a deposition process such as, for example, CVP, PECVD, PVD, atomic layer deposition (ALD) or spin-on coating. Next, interconnect dielectric material layer 316 is formed on the dielectric capping layer 308. The interconnect dielectric material layer 316 can be formed utilizing one of the deposition processes mentioned above for interconnect dielectric material layer 304. The interconnect dielectric material layer 316 includes any interlevel dielectric material (inorganic or organic) that does not solely contain elemental silicon, as is defined above for the plurality of interconnect dielectric material layers 104. Openings are then formed into interconnect dielectric material layer 316 utilizing at least one iteration of photolithographic patterning; during the forming of the opening into the interconnect dielectric material layer 316, the another dielectric capping layer 314 is opened so as to physically expose a surface of electrically conductive structure 312. The openings are then filled with one of the electrically conductive metals or metal alloys mentioned above for first electrically conductive structures 106. The filling of the opening with an electrically conductive metal or metal alloy can include any well known deposition process including, for example, CVD, PECD, plating, or sputtering. A planarization process such as, for example, chemical mechanical planarization (CMP), can follow the deposition of the electrically conductive metal or metal alloy. These steps of metal fill and planarization provide electrically conductive structure 318. It is again noted that dielectric capping layers 306 and/or 314 are optional and need not be used in some embodiments of the present invention. For interconnect levels can be formed as appropriate.

Figure 12:
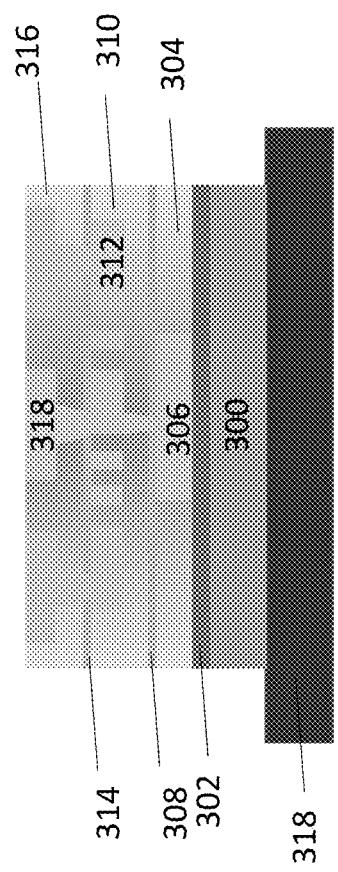

Next, and as is shown in FIG. 12, a physically exposed surface of the supporting wafer 300 shown in FIG. 11 is attached to a dicing tape that is present on a dicing frame of a dicing apparatus. The structure shown in FIG. 12 is then diced to provide a plurality of silicon-less link chiplets 102; note that interconnect dielectric material layers 304, 310 and 316 together with dielectric capping layers 318 and 314 provide the plurality of interconnect dielectric material layers 104 of the silicon-less link chiplet 102, while the electrically conductive structures 306, 312, and 318 provide the first electrically conductive structures 106 of the silicon-less link chiplet 102. After dicing the diced chiplets are removed from the dicing tape, and a ready for further processing. At this time of the present invention, the supporting wafer 300 and buffer layer 302 remain on a surface of each diced silicon-less link chiplet 102. Each silicon-less link chiplet 102 that is formed has a width from about 0.2 mm to about 30 mm, and a length from about 0.2 mm to about 30 mm; the term "about" denoting that the value can be within ±10% of the given value.

Figure 13:
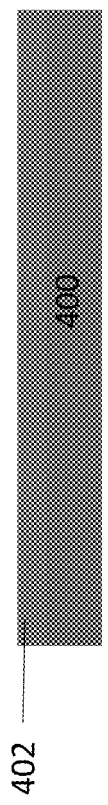
Figure 14:
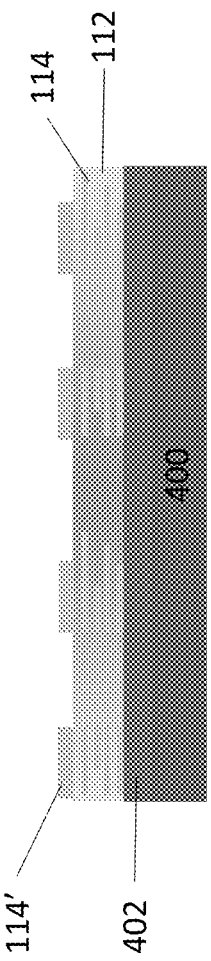

Referring now to FIGS. 13-19, there are illustrated the various processing steps used in fabricating the interposer structure 100 of the present invention. The process of fabricating the interposer structure 100 begins by forming a temporary bonding layer 402 on a surface of a handle substrate 400 as is shown in FIG. 13. Handle substrate 400 is composed of any handler material including, but not limited to, silicon, glass, sapphire or a ceramic. In some embodiments, the handle substrate 400 can be in the form of a wafer. In other embodiments, the handle substrate 400 can be in the form of a panel. Temporary bonding layer 402 can be composed of any adhesive material including, for example, an adhesive tape or adhesive glue. The temporary bonding layer 402 can be applied to the surface of the handle substrate 400 utilizing techniques well known to those skilled in the art.

After forming the temporary bonding layer 402 on the handle substrate 400, a multilevel structure is formed that includes the plurality of second electrically conductive structures 114, as defined above, and the plurality of redistribution dielectric material layers 112, as defined above. As stated above, the second electrically conductive structures 114 are embedded in the plurality of redistribution dielectric material layers 112. The multilevel structure (112/114) can be formed by techniques well known in the art including a damascene process. Element 114' is a last level second electrically conductive structure that can be formed deposition and photolithography.

Figure 15:
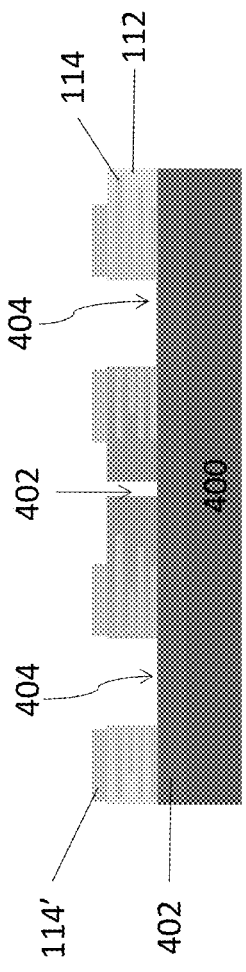

Next, and as is shown in FIG. 15, cavities 404 are formed through portions of the redistribution dielectric material layers 112 that do not contain any second electrically conductive structures 114. The cavities 404, which extend to the underlying temporary bonding layer 402, have dimensions (at least length and width) that are suitable for housing a silicon-less link chiplet 102. Cavities 404 can be formed by etching physically exposed portions of the redistribution dielectric material layers 112. In some embodiments, an etch mask can be formed prior to the etching so as to ensure proper alignment of the cavities. In some embodiments, and as is also shown in FIG. 15, at least one dice opening 402 can be formed into portions of the redistribution dielectric material layers 112. Each dice opening 402 also extends to the surface of the temporary bonding layer 402; dice openings have dimensions that are much smaller than cavities 404. The dice openings 402 can be formed together with, prior to, or after forming, the cavities 404. Dice openings 402 can be formed by etching utilizing an etch mask.

After providing the cavities 404 and optional dice opening 402 as is shown in FIG. 15, a pick and place method is used to insert one of the diced silicon-less link chiplets 102 including the supporting wafer 300 and buffer layer 302 into each of the cavities 404. FIG. 16 illustrates the structure after performing the pick and place method. As can be seen in FIG. 16, each diced silicon-less link chiplet 102 is inserted face down such that a surface of the diced silicon-less link chiplet 102 directly contacts the temporary bonding layer 402.

Next, and as shown in FIG. 17, a gap fill material layer 406L is formed. The gap fill material layer 406L is formed over the entire structure shown in FIG. 16 and within any gaps, including the optional dice openings 402, that are present in that structure. The gap fill material layer 406L is composed of any gap fill material including, for example, inorganic oxides and inorganic nitrides. The gap fill material layer 406L can be formed utilizing any known gap filling deposition process such as, for example, CVD or PECVD.

After forming the gap fill material layer 406L, a material removal process such as, for example, CMP, is employed to remove all material above electrically conductive structures 318 and 314'. The resultant structure that is formed after performing this material removal process is shown in FIG.

18. A portion of the gap fill material layer 406L remains after the material removal process. The remaining portion of the gap fill material layer 406L can be referred to herein as a gap fill material 406.

Next, and as shown in FIG. 19, an uppermost redistribution dielectric material layer 408 is then formed on the exposed surfaces of the structure shown in FIG. 18. The uppermost redistribution dielectric material layer 408 includes one of the dielectric materials mentioned above for the redistribution dielectric material layer 112. The uppermost redistribution dielectric material layer 408 can be formed utilizing one of the deposition processes mentioned above for forming the redistribution dielectric material layer 112.

Metallic pads 116 and micro metallic pads 109, as are also shown in FIG. 19, can then formed. Metallic pads 116 and micro metallic pads 109 can be formed utilizing any well known process including, for example, under bump metallization (UBM). As is shown, each micro metallic pad 109 directly contacts a surface an underlying electrically conductive structure 306, and each metallic pad 119 directly contacts a surface of the last level second electrically conductive structure 114'.

Figure 20:
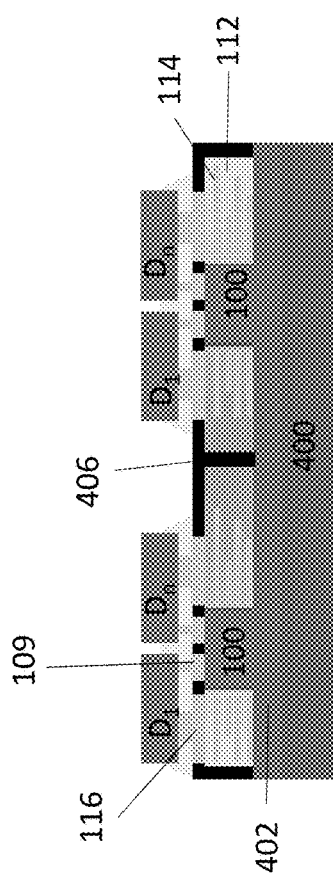

Referring now to FIGS. 20-23, there are illustrated processing steps used in assembling a semiconductor packaging device in accordance with the present invention. As shown in FIG. 20, the assembly process begins by attaching die ($D_1$, $D_n$) to the metallic pads 116 and micro metallic pads 109 shown in FIG. 19. The die ($D_1$, $D_n$) can be attached to utilizing a flip chip bonding process. Prior to attaching, a pick and place method is used to position the die ($D_1$, $D_n$) on the appropriate metallic pads 116 or micro metallic pads 109. An underfill material can be formed after the attaching of the die ($D_1$, $D_n$).

Figure 21:
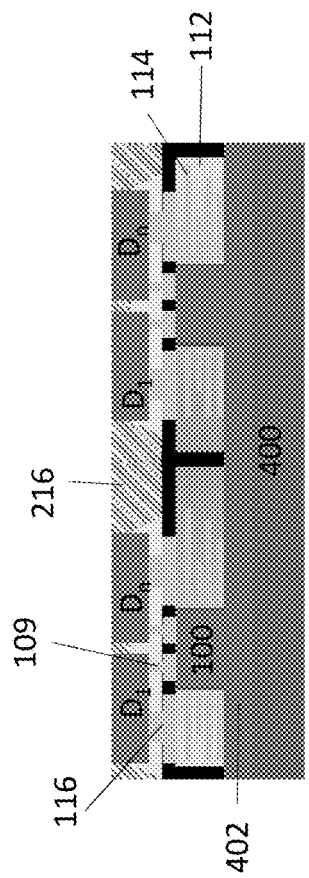

Next, and as is shown in FIG. 21, epoxy molding compound containing layer 216, as defined above, can then be formed to at least laterally surround each die ($D_1$, $D_n$). The epoxy molding compound containing layer 216 can be formed by a deposition process, followed by curing. In some embodiments, a material removal process such as, for example, CMP, can be used to remove the epoxy molding compound containing layer 216 from atop the die ($D_1$, $D_n$).

Figure 22:
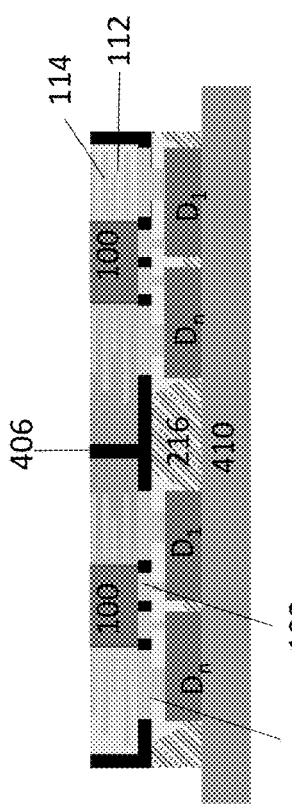
FIGS. 20-23 illustrate the various processing steps used in assembling a semiconductor packaging device in accordance with the present invention.
Figure 23:
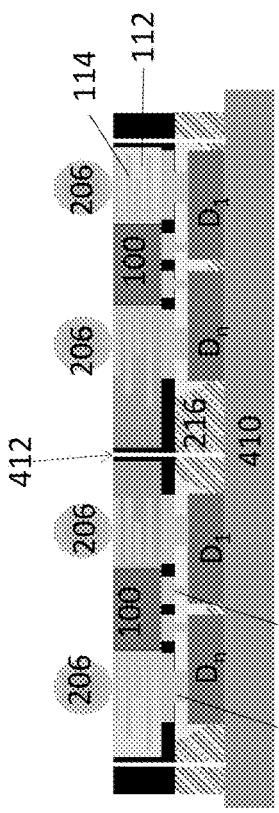

The assembly shown in FIG. 21 is then flipped 180° degrees and then the flipped assembly is mounted on dicing tape 410 as is shown in FIG. 22. Next, and as shown in FIG. 23, the handle substrate 400 and temporary bonding layer 402 are removed utilizing techniques well known in the art, and thereafter solder balls 206, as described above, are formed on the exposed surface of the second electrically conductive structures 114 that are embedded in the redistribution dielectric material layer 112. After forming the solder balls 206, and as is also shown in FIG. 23, dicing is performed to form dice openings 412 in the assembly.

Next, the diced assemblies are removed from the dicing tape 410, and the diced assemblies can then be attached to a PCB 200. In some embodiments, the diced assemblies are first attached to an organic substrate 204 prior to attaching to a PCB 200.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor packaging device comprising:
   an interposer structure electrically connecting a printed circuit board to a plurality of die, wherein the interposer structure comprises:
   a redistribution layer interposer; and
   a silicon-less link chiplet laterally surrounded by, and embedded in, the redistribution layer interposer;
   an organic substrate positioned between the printed circuit board and the interposer structure, the organic substrate having a first side and a second side that is opposite the first side;
   an array of solder balls disposed between the organic substrate first side and the interposer structure, the array of solder balls electrically connecting the interposer structure with the organic substrate second side; and
   an underfill material including a composite material containing an epoxy polymer and a filler surrounding the interposer structure and positioned between the organic substrate second side and the interposer structure to encase and cushion the array of solder balls,
   wherein the silicon-less link chiplet comprises a first multilevel structure including a plurality of first electrically conductive structures and a plurality of interconnect dielectric material layers, wherein the first electrically conductive structures are embedded in the plurality of interconnect dielectric material layers, wherein the plurality of first electrically conductive structures have a first density within the silicon-less link chiplet,
   wherein the redistribution layer interposer comprises a second multilevel structure including a plurality of second electrically conductive structures and a plurality of redistribution dielectric material layers, wherein the second electrically conductive structures are embedded in the plurality of redistribution dielectric material layers, wherein the plurality of second electrically conductive structures have a second density within the redistribution layer interposer that is less than the first density, and
   wherein the first density is 10× greater than the second density, and
   wherein the array of solder balls disposed between the organic substrate first side comprise at least a first solder ball and a second solder ball, the first solder ball being formed on a physically exposed surface of the plurality of second electrically conductive structures and electrically connecting the redistribution layer interposer of the interposer structure with the organic substrate second side, the second solder ball being formed on a physically exposed surface of the plurality of first electrically conductive structures and electrically connecting the silicon-less link chiplet of the interposer structure with the organic substrate second side.

2. The semiconductor packaging device of claim 1, wherein the silicon-less link chiplet provides inter-die connection between two adjacent die of the plurality of die.

3. The semiconductor packaging device of claim 2, wherein the redistribution layer interposer surrounding the silicon-less link chiplet provides a connection to one of the die of the plurality of die.

4. The semiconductor packaging device of claim 1, wherein each redistribution dielectric material layer of the plurality of redistribution dielectric material layers is composed of an organic dielectric material.

5. The semiconductor packaging device of claim 1, further comprising an epoxy molding compound containing layer at least laterally surrounding the plurality of die, and contacts at least one surface of the redistribution layer interposer.

6. The semiconductor packaging device of claim 5, wherein the epoxy molding compound containing layer is further located on a topmost surface of each die of the plurality of die.

7. The semiconductor packaging device of claim 6, wherein the least one surface is a topmost surface of the redistribution layer interposer.

8. The semiconductor packaging device of claim 6, wherein the least one surface is a topmost surface and a sidewall surface of the redistribution layer interposer.

9. The semiconductor packaging device of claim 5, further comprising a heat spreader located on a topmost surface of the epoxy molding compound containing layer and a topmost surface of each die of the plurality of die.

10. The semiconductor packaging device of claim 5, further comprising an integrated heat spreader encasing the interposer structure and the plurality of die.

11. The semiconductor packaging device of claim 10, further comprising a void located between an interior sidewall of the integrated heat spreader and both the epoxy molding compound containing layer and the redistribution layer interposer.

12. The semiconductor packaging device of claim 1, wherein the first density is 100× greater than the second density.

13. The semiconductor packaging device of claim 1, wherein the first electrically conductive structures are made from a material selected from a group consisting of copper, aluminum, tungsten and cobalt.

14. The semiconductor packaging device of claim 1, wherein the underfill material includes at least one resin having a coefficient of thermal expansion that substantially matches a coefficient of thermal expansion of the array of solder balls.

15. The semiconductor packaging device of claim 1, wherein the amount of the plurality of first electrically conductive structures per unit volume present in the silicon-less link chiplet is greater than the amount of the plurality of second electrically conductive structures per unit volume present in the redistribution layer interposer.

* * * * *